(12) United States Patent
Samoilov et al.

(10) Patent No.: US 6,494,959 B1
(45) Date of Patent: Dec. 17, 2002

(54) PROCESS AND APPARATUS FOR CLEANING A SILICON SURFACE

(75) Inventors: Arkadii V. Samoilov, Sunnyvale, CA (US); Dale R. DuBois, Los Gatos, CA (US); Bradley M. Curelop, San Jose, CA (US); David R. Carlson, Santa Clara, CA (US); Paul B. Comita, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/493,694

(22) Filed: Jan. 28, 2000

(51) Int. Cl.[7] .................................................. C23G 1/00
(52) U.S. Cl. .............................. 134/2; 134/11; 134/31; 216/74; 216/79; 438/906
(58) Field of Search ................................ 134/2, 11, 31; 216/63, 74, 79; 438/906

(56) References Cited

U.S. PATENT DOCUMENTS

| | | | |
|---|---|---|---|
| 3,652,324 A | | 3/1972 | Chu et al. |
| 4,590,091 A | | 5/1986 | Rogers, Jr. et al. |
| 4,855,254 A | | 8/1989 | Eshita et al. |
| 4,855,258 A | | 8/1989 | Allman et al. |
| 4,956,538 A | | 9/1990 | Moslehi |
| 5,022,961 A | | 6/1991 | Izumi et al. |
| 5,028,560 A | | 7/1991 | Tsukamoto et al. |
| 5,032,545 A | | 7/1991 | Doan et al. |
| 5,089,441 A | | 2/1992 | Moslehi |
| 5,104,694 A | | 4/1992 | Saito et al. |
| 5,264,396 A | | 11/1993 | Thakur et al. |
| 5,294,568 A | | 3/1994 | McNeilly et al. |
| 5,296,258 A | | 3/1994 | Tay et al. |
| 5,303,558 A | | 4/1994 | Caton et al. |
| 5,322,809 A | | 6/1994 | Moslehi |
| 5,326,406 A | * | 7/1994 | Kaneko et al. ................. 134/1 |
| 5,332,444 A | * | 7/1994 | George et al. ................. 134/1 |
| 5,352,636 A | | 10/1994 | Beinglass |
| 5,360,769 A | | 11/1994 | Thakur et al. |
| 5,403,434 A | * | 4/1995 | Moslehi ......................... 134/1 |
| 5,445,994 A | | 8/1995 | Gilton |
| 5,790,750 A | | 8/1998 | Anderson |
| 5,899,752 A | | 5/1999 | Hey et al. |

FOREIGN PATENT DOCUMENTS

| | | |
|---|---|---|
| EP | 430030 A2 | 11/1990 |
| EP | 870852 A1 | 4/1998 |
| JP | 3-22527 | 1/1991 |
| JP | 4-30514 | 2/1992 |

OTHER PUBLICATIONS

T. Yamazaki et al., "Investigation of Thermal Removal of Native Oxide from Si (100) Surfaces in Hydrogen for Low–Temperature Si CVD Epitaxy", J. Electrochem Soc., vol. 139, No. 4, Apr. 1992.

* cited by examiner

*Primary Examiner*—Randy Gulakowski
*Assistant Examiner*—M. Kornakov
(74) *Attorney, Agent, or Firm*—Blakely Sokoloff Taylor & Zafman

(57) ABSTRACT

A low pressure-high hydrogen flow rate process of cleaning a silicon wafer surface is described. The combination of process pressures below about 1 Torr with hydrogen flow rates up to about 3 SLM has been found to remove substantially all oxygen contamination from the silicon wafer surface at process temperatures less than about 800° C. without the use of a reactive gas. After processing at such process pressures and flow rates, even lower levels of oxygen contamination may be achieved by then increasing the process pressure, the hydrogen flow rate, and the process temperature, though the process temperature still remains less than 800° C. The combination of low pressure and high hydrogen flow rate can be achieved using a vacuum pumping speed of at least 30 cubic meters per hour. The present invention also describes an apparatus for cleaning a silicon wafer surface in which the processes of the present invention and other processes can be practiced.

41 Claims, 9 Drawing Sheets

PROCESS AND APPARATUS FOR CLEANING A SILICON SURFACE

FIELD OF THE INVENTION

The present invention relates generally to semiconductor processing and, more particularly, to a process and an apparatus for cleaning silicon surfaces.

BACKGROUND

The fabrication of semiconductor devices on a silicon wafer involves the formation of layers of various electronic materials, such as epitaxial silicon layers, passivation layers, insulation layers, etc., on a silicon surface. The performance of the semiconductor device depends upon the quality of the layers formed, which in turn depends strongly upon the cleanliness of the processing environment and of the underlying silicon surface.

Silicon surfaces are particularly susceptible to native oxide contamination. Native oxides are non-stoichiometric silicon oxides that can form any time a silicon surface is exposed to ambient atmosphere. Such exposure inevitably occurs during the course of device fabrication, for example, when wafers are being loaded into a processing chamber. Because the native oxides form under non-controlled atmospheric conditions, native oxides tend to grow at different rates from wafer to wafer, leading to different device performance depending on the wafer from which the device was formed. Moreover, the presence of native oxides may interfere with the electrical properties of the individual device, resulting in, for example, device noise, degraded performance, or even total failure.

To achieve acceptable semiconductor device yields per wafer and acceptable device performance, the silicon surface must be free of contaminants and impurities such as oxygen and carbon. One method of removing native oxides and other contaminants involves baking the wafer at a high-temperature, for example, greater than 1000° C., immediately prior to the formation or deposition of a layer of electronic material. Typically, this involves baking the wafer in the same chamber in which the subsequent deposition step is performed. Such baking methods, however, generally cannot be used with wafers having devices thereon because most semiconductor devices cannot withstand such high temperatures.

To lower the baking temperature, some cleaning methods introduce a reactive gas, such as $SiH_4$ or $Si_2H_6$, or $GeH_4$, or $NF_3$, into the chamber to help remove the native oxide layer and other contaminants. The use of such reactive gases allows the baking temperature to be reduced below 950° C. However, such reactive gases not only attack the native oxide layer, but also other layers and devices on the wafer. The use of such reactive gases can leave residues in the chamber that can contaminate the wafers that are supposed to be cleaned. Some reactive gases also can attack the chamber walls. The chamber will thus require periodic cleaning and maintenance to remove the residues and repair any corrosion incurred during the wafer cleaning process.

SUMMARY OF THE INVENTION

One aspect of the present invention provides a process of cleaning a silicon surface. In one embodiment, the process involves transferring a silicon wafer into a chamber and maintaining the silicon wafer at a process temperature of not greater than about 800° C. and a process pressure of less than about 1 Torr while flowing hydrogen gas across a surface of the silicon wafer.

In another aspect, the present invention provides an apparatus for cleaning a surface of a silicon wafer. In one embodiment, the apparatus includes a housing having therein a chamber defined by surfaces comprised of quartz. A reflector is positioned outside the chamber. A susceptor is positioned within the chamber and configured to accommodate the silicon wafer such that a first surface of the silicon wafer faces the reflector. A heater is configured to radiate heat towards only a second surface of the silicon wafer. An inlet port and a vacuum port are positioned opposite each other such that a gas introduced from the inlet port flows across the first surface of the silicon wafer towards the vacuum port.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention provides a method and an apparatus for cleaning a silicon surface. The methods and apparatuses of the present invention can be incorporated into a multi-chamber-clustered semiconductor processing system, like the one shown in FIG. 1. One such system is supplied by Applied Materials, Inc. in Santa Clara, Calif. under the Centura® mark. Though the descriptions that follow will discuss the present invention in the context of a multi-chamber-clustered system, those of ordinary skill will recognize that the methods and apparatuses of the present invention are not limited to use with such systems.

Figure 1:
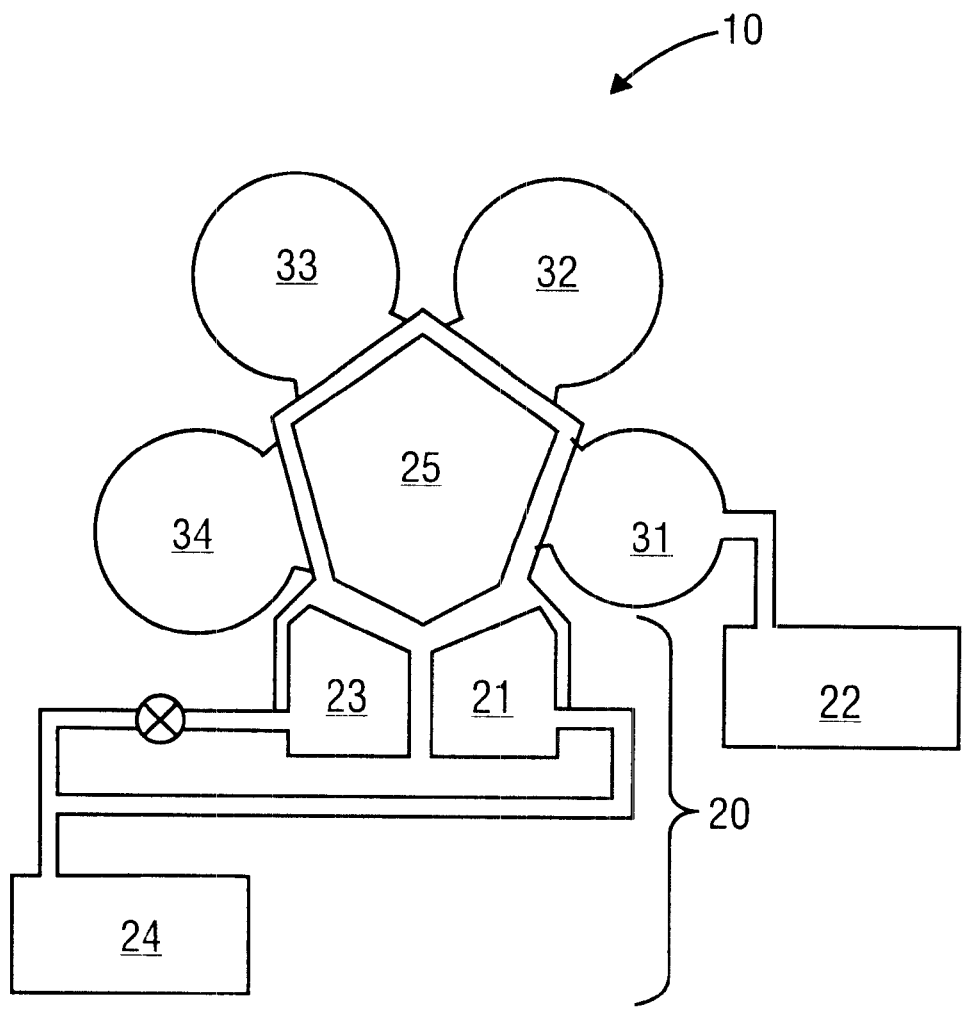
FIG. 1 shows a top view of a multi-chamber-clustered semiconductor processing system.

FIG. 1 shows one embodiment of a multi-chamber-clustered system 10 wherein a silicon wafer can be transported from one single-wafer processing chamber to another without breaking vacuum. A central load-lock system 20 comprises two load-locks 21, 23, each of which is evacuated by a vacuum pump 24. Silicon wafers are loaded into one of the load locks 21, which is then evacuated, and then a wafer is transported into a central transfer chamber 25. The transfer chamber 25 is kept constantly under a dry evacuated environment, typically around 100 Torr or less of dry $N_2$, and contains equipment, such as a robotic arm, to move the wafer from one processing chamber into another.

The multi-chamber-clustered system has a plurality of single-wafer processing chambers 31, 32, 33, 34 that are arranged around and connected to the transfer chamber 25. A fabrication operation, such as masking, etching, deposition, etc., is carried out in each processing chamber. The wafer is processed in one processing chamber, and then transported into the transfer chamber 25 from which it is transferred to the next processing chamber. After the wafer has been processed through the series of the processing chambers 31, 32, 33, 34, it is transported via the transfer chamber 25 to either of the load-locks 21, 23. Several wafers can be processed simultaneously in different chambers (one wafer per chamber). This allows a high throughput of wafers to be continually processed through the multi-chamber-clustered system 10.

A process in accordance with one aspect of the present invention involves cleaning a silicon wafer surface in a low pressure and high hydrogen flow rate environment. The inventors have discovered that maximizing the hydrogen flow rate while maintaining a low pressure (which can be achieved using high pumping speeds) allows for native oxide and other contaminant removal at relatively low temperatures and without the use of a reactive gas. Neither the use of low pressures with lower hydrogen flow rates, or higher pressures with high hydrogen flow rate, achieved the same levels of cleanliness at low temperatures as the combination of low pressure and high hydrogen flow rates did. In many cases, the processes of the present invention are able to remove substantially all interfacial contamination of oxygen, carbon, nitrogen, chlorine, and fluorine as can be detected using currently available analytical techniques, and leave the silicon wafer surface substantially free of contamination.

Figure 2:
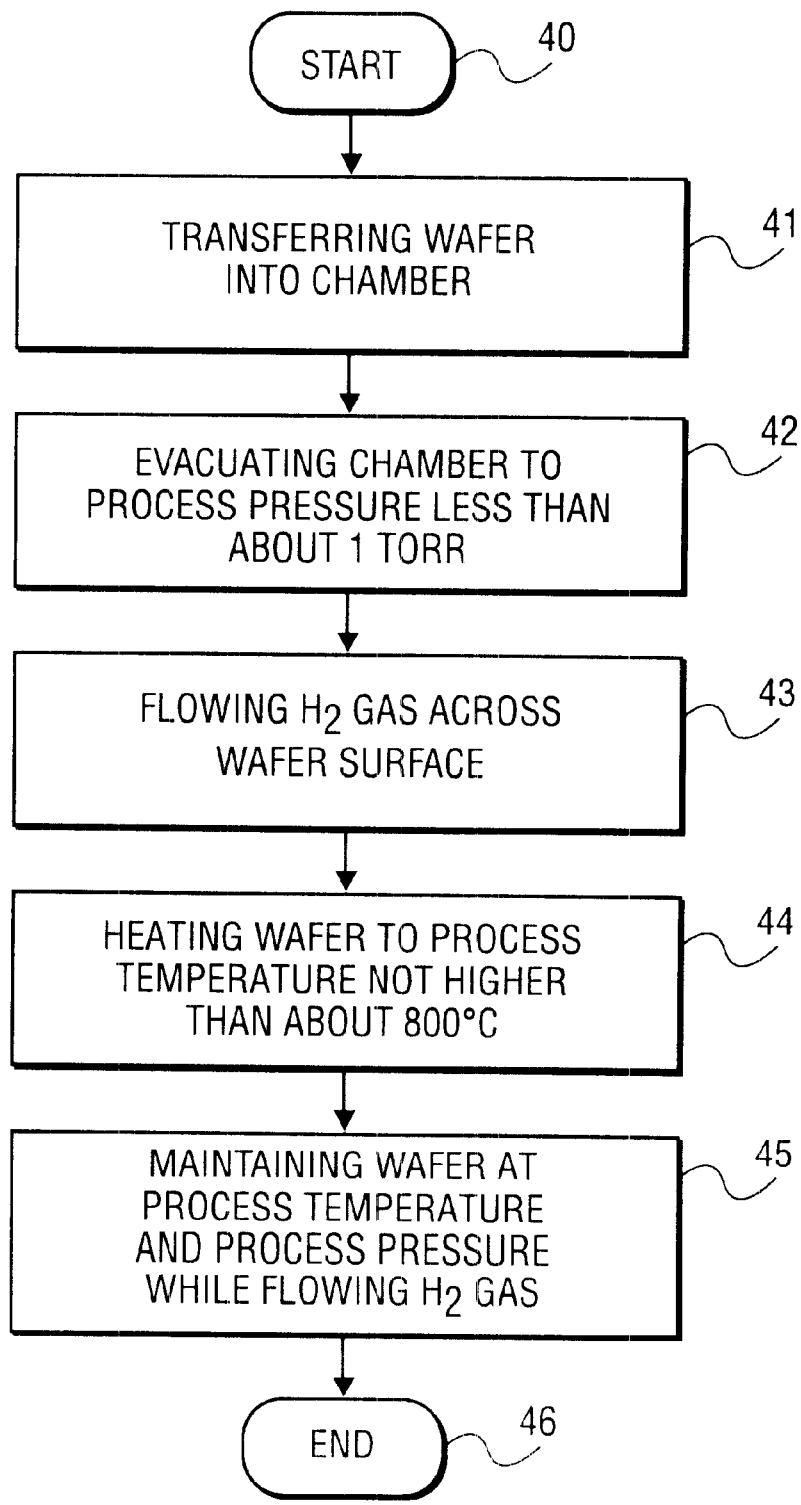
FIG. 2 is a flowchart showing one embodiment of a process according to the present invention.

One embodiment of a process according to the present invention is illustrated in the flowchart of FIG. 2. Before a silicon wafer is loaded into, e.g., one of the load locks 21 and before the process starts at 40, the silicon wafer typically is pre-treated by dipping in a hydrogen fluoride (HF) solution, rinsing and drying, as is well-known in the art.

The process according to the present invention begins at 40 with transferring a silicon wafer from, e.g., a transfer chamber 25, into a processing chamber, e.g., 31, 32, 33, or 34 at step 41. The processing chamber may be a deposition chamber or other processing chamber wherein the silicon wafer will be processed after the wafer is cleaned, or the processing chamber may be a dedicated cleaning chamber, e.g., 31, connected to a pump 22. The silicon wafer may be an unprocessed wafer, or a semiprocessed wafer having silicon exposed at a surface thereof. Thus, "silicon wafer" includes without limitation doped and undoped silicon, monocrystalline or epitaxially grown silicon, and silicon wafers having devices, interconnects, junctions, layers, windows, patterns, or other electronic features thereon.

In one embodiment, the silicon wafer is transferred into the processing chamber at a temperature that is lower than a process temperature at which the silicon wafer will be cleaned. The inventors have observed that transferring the silicon wafer at a lower temperature advantageously reduces the time needed to clean the silicon wafer surface. The silicon wafer generally is transferred into the processing chamber at a transfer temperature of less than about 600° C., and typically between about 450° C. and about 600° C. In one embodiment, the transfer temperature is about 550° C.

Typically, the silicon wafer is transferred into the processing chamber at a pressure higher than a process pressure at which the silicon wafer will be cleaned. In general, the pressure at which the silicon wafer is transferred into the chamber is less than about 100 Torr, and typically falls in the range of about 20 Torr to about 100 Torr.

After the silicon wafer is transferred into the processing chamber, the processing chamber is evacuated at step 42 to a process pressure of less than about 1 Torr. The process pressure is the total pressure within the processing chamber while the silicon wafer surface is being cleaned. Typically, the process pressure is between about 0.1 Torr and about 1 Torr. In one embodiment, the process pressure is between about 0.2 Torr and about 0.5 Torr. In another embodiment, the process pressure includes a partial pressure of oxygen and water of less than about 10 $\mu$Torr, and typically between about 1 $\mu$Torr and about 5 $\mu$Torr. In one embodiment, the partial pressure of oxygen and water is about 3 $\mu$Torr.

At step 43, hydrogen gas is flowed over a surface of the silicon wafer at a flow rate of up to about 3 standard liters per minute (SLM) through a chamber volume of about 10 liters. In accordance with the present invention, it is desired to maximize the flow rate of hydrogen while maintaining the process pressure below about 1 Torr. It has been observed that 3 SLM is about the maximum flow rate of hydrogen gas that can be practicably achieved while maintaining the process pressure below about 1 Torr using currently available vacuum pumps. It is envisioned that, as higher pumping speed vacuum systems become available, higher maximum flow rates will become practicable. In current embodiments, a flow rate between about 0.03 SLM and about 3 SLM of hydrogen gas is typically used. In another embodiment, a flow rate of about 0.3 SLM is used.

As indicated above, high pumping speeds are used to achieve high hydrogen flow rates while maintaining the process pressure at less than about 1 Torr. Pumping speeds of greater than about 30 cubic meters per hour have been found to be effective in the processes of the present invention. Typically, pumping speeds between about 30 cubic meters per hour and about 200 cubic meters per hour are used. In one embodiment, a pumping speed of about 100 cubic meters per hour was found to provide a good balance between cleaning efficacy and cost.

At step 44, the silicon wafer is heated to a process temperature not higher than about 800° C. Typically, the process temperature is between about 700° C. and about 800° C. In one embodiment, the process temperature is between about 750° C. and about 775° C. In another embodiment, the process temperature is about 770° C.

In one embodiment, the silicon wafer is heated to the process temperature only after the processing chamber has been evacuated to the process pressure. This allows contaminants brought into the chamber during wafer transfer to be removed.

At step 45, the silicon wafer is maintained at the process temperature and the process pressure while hydrogen gas is flowed across the surface of the silicon wafer until substantially all interfacial oxygen contamination is removed. Typically, the silicon wafer is maintained at the process temperature and pressure while flowing hydrogen gas across the surface for less than about 5 minutes. In one embodiment, the silicon wafer is maintained at the process temperature and pressure while flowing hydrogen gas across the surface for between about 1 minute and about 3 minutes. In another embodiment, the silicon wafer is maintained at the process temperature and pressure while flowing hydrogen gas across the surface for about 2 minutes. Oxygen contamination levels of less than about $1\times10^{18}$ atoms per cubic centimeter may be achieved with the processes described above.

The process ends at 46, at which point the hydrogen flow is stopped. If the silicon wafer is to be processed further in the processing chamber, the pressure and temperature are adjusted for the next processing step. If the silicon wafer is to be transferred out of the processing chamber, the wafer is returned to the transfer temperature and the processing chamber to the transfer pressure (typically by introducing nitrogen gas), and the silicon wafer is then transferred out of the processing chamber into, e.g., a transfer chamber.

Figure 3:
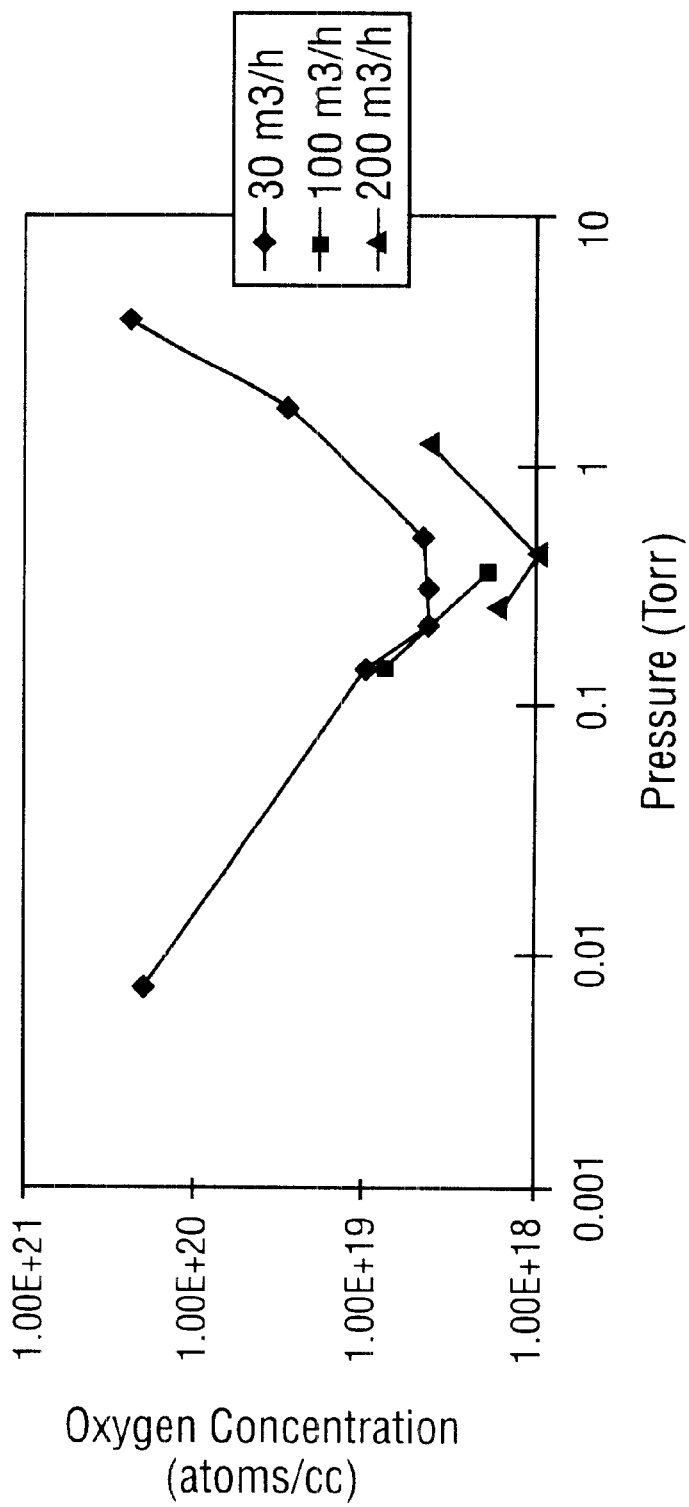
FIG. 3 is a graph showing interfacial oxygen contaminant concentration on a silicon surface after cleaning in accordance with the present invention as a function of process pressure at three hydrogen pumping speeds.

FIG. 3 shows concentration of interfacial oxygen contamination remaining on a silicon wafer surface as a function of process pressure after cleaning with processes of the present invention at three different pumping speeds. Surprisingly, the inventors observed that, below a certain process pressure, the interfacial oxygen concentration does not continue to decrease as the process pressure is decreased, but actually begins to increase, regardless of pumping speed. As can be seen in FIG. 3, the interfacial oxygen concentration has a minimum at a process pressure between about 0.1 and about 1 Torr. Below a process pressure of about 0.3 Torr, the interfacial oxygen concentration begins to increase. Even with process pressures around 0.01 Torr, the interfacial oxygen concentration level achieved is higher than that achieved with process pressures around 0.3 Torr.

Figure 4A:
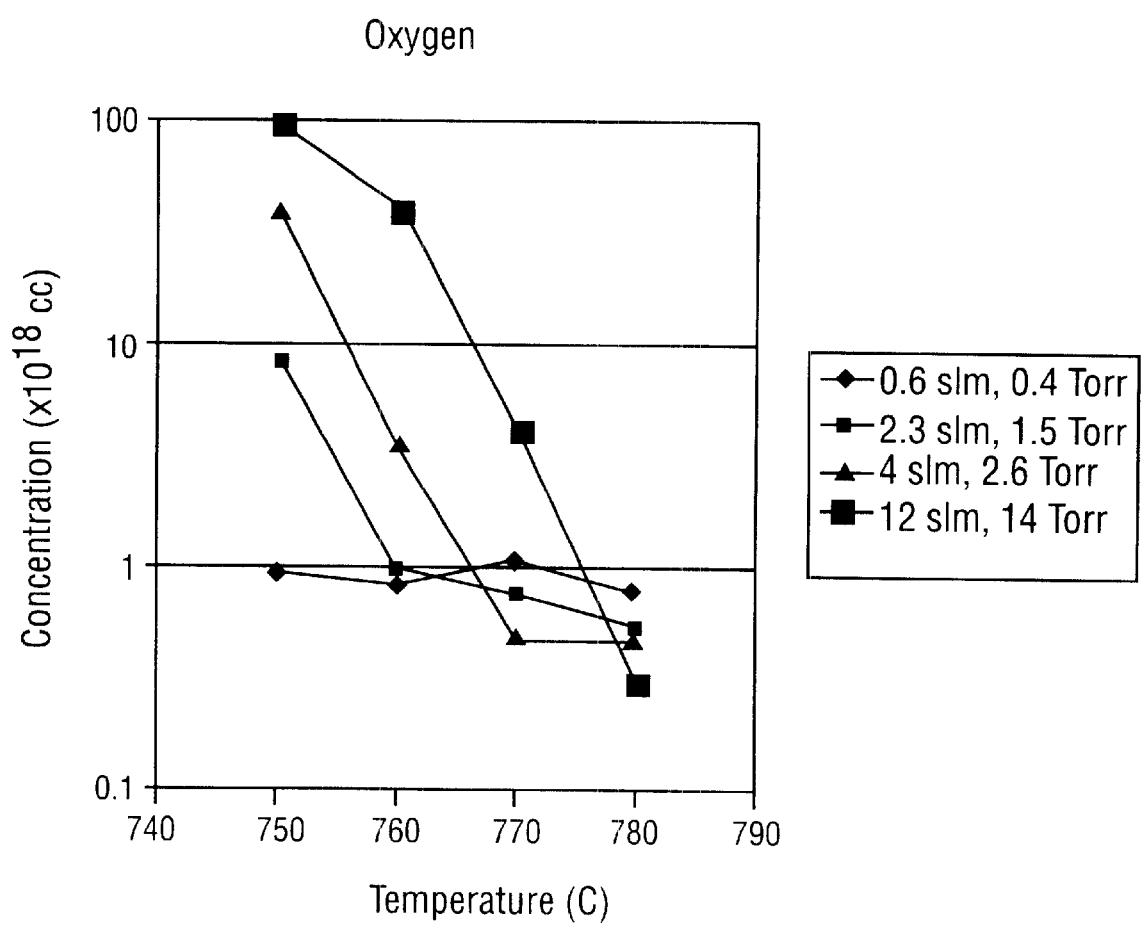
FIGS. 4A and 4B show oxygen and carbon contaminant concentrations, respectively, on a silicon surface as a function of process temperature at four process pressures and the corresponding four hydrogen flow rates.
Figure 4B:
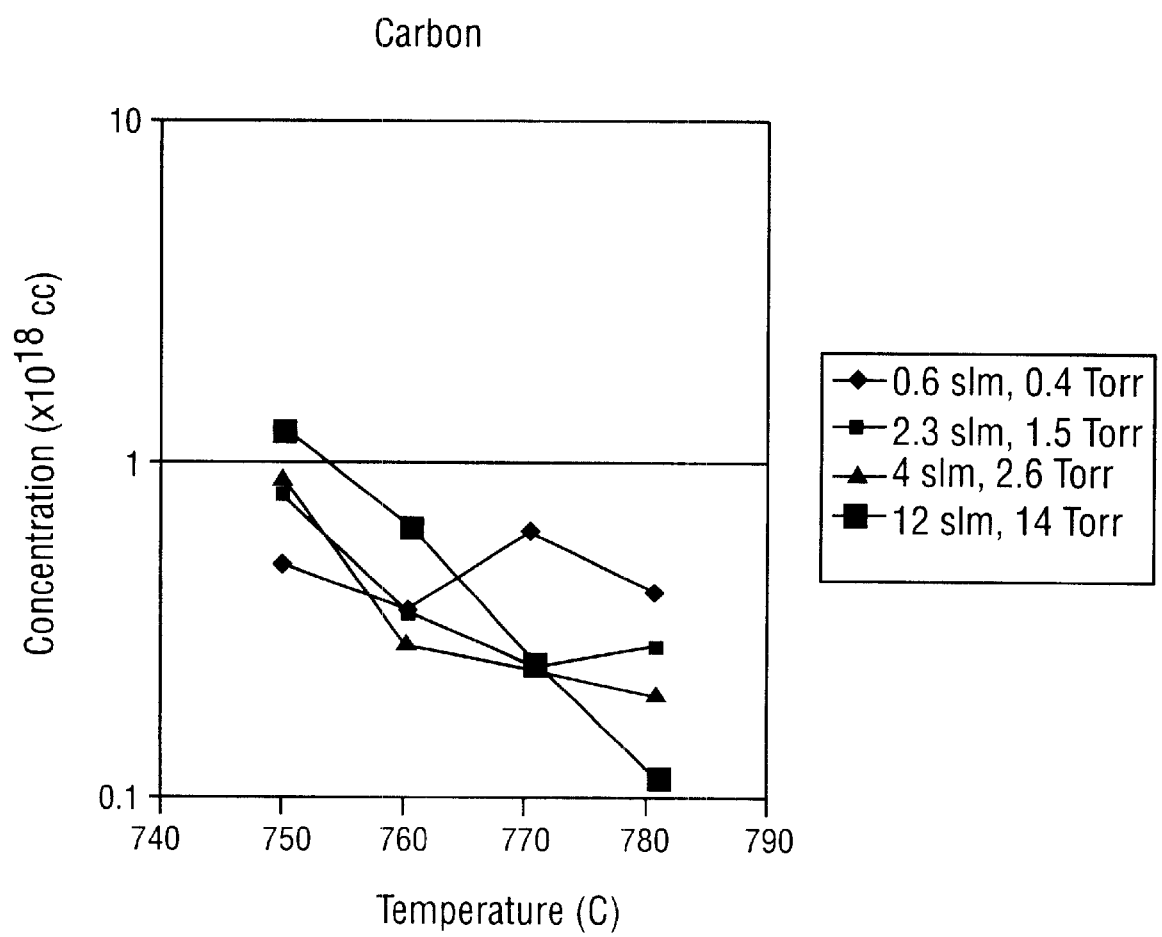

FIGS. 4A and 4B show concentrations of oxygen and carbon contamination, respectively, remaining on a silicon wafer surface as a function of process temperature after cleaning with processes of the present invention at four different process pressures (and corresponding four hydrogen flow rates). As the graphs in FIGS. 4A and 4B show, at about 750° C., the lowest oxygen and carbon contamination levels were observed at process pressures of less than about 1 Torr. As the process temperature is increased from about 750° C. to about 780° C., the oxygen and carbon contamination levels achieved with process pressures of less than about 1 Torr were seen to remain about the same.

However, at higher process pressures, increasing the process temperature caused the oxygen and carbon contamination levels to decrease markedly. At about 780° C., lower oxygen and carbon contamination levels were observed at process pressures greater than 1 Torr, particularly greater than about 10 Torr, than were seen at process pressures of less than about 1 Torr. In the case of oxygen, a two- to three-fold decrease in contamination level was observed between the process pressure of about 0.4 Torr (hydrogen flow rate of about 0.6 SLM) and about 14 Torr (12 SLM hydrogen) at 780° C. In the case of carbon, a three- to four-fold decrease in contamination level was observed over the same range.

Figure 5:
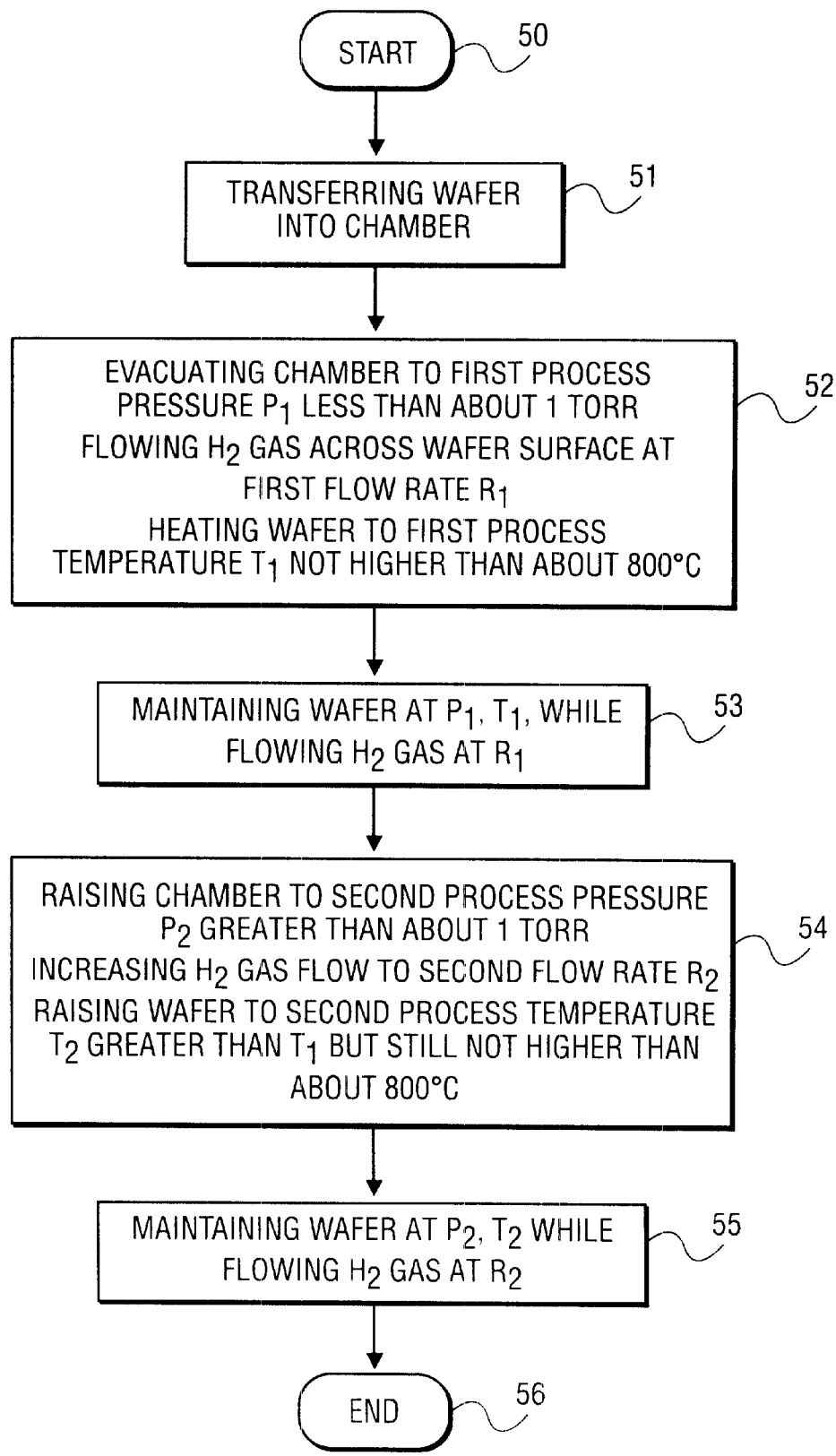
FIG. 5 is a flowchart showing another embodiment of a process according to the present invention.

FIG. 5 illustrates an embodiment of a process according to the present invention that takes advantage of this observed decrease in contamination levels. Steps 50 through 53 of this embodiment are similar to steps 40 to 45 of the embodiment described above, with reference to FIG. 2. The process begins at step 50 by transferring a silicon wafer from, e.g., a transfer chamber, into a process chamber at step 51. Typically, the silicon wafer is pre-treated with a hydrogen fluoride (HF) dip, followed by rinsing and drying, before being transferred into the process chamber, as described above.

After the silicon wafer is transferred into the process chamber, the chamber is evacuated to a first process pressure ($P_1$), hydrogen gas is flowed over a surface of the silicon wafer at a first flow rate ($R_1$), and the wafer is heated to a first process temperature ($T_1$) at a step 52. The first process pressure is less than about 1 Torr, and the first flow rate advantageously is maximized while maintaining the first process pressure at less than about 1 Torr. Given currently available vacuum pumps, the first flow rate typically is not higher than about 3 SLM. The first process temperature is not higher than about 800° C., and typically is not higher than about 770° C. In one embodiment, the first process temperature is about 750° C.

The silicon wafer is maintained at step 53 at the first process pressure and at the first process temperature while hydrogen gas is flowed at the first flow rate across the surface of the silicon wafer for less than about 5 minutes, and typically less than about 3 minutes. Step 53 can achieve oxygen contamination levels of less than about $1\times10^{18}$ atoms per cubic centimeter. It may be desired, however, to attain even lower concentrations of interfacial oxygen.

At step 54, the chamber pressure is raised to a second process pressure ($P_2$) greater than the first process pressure ($P_1$), and the silicon wafer is heated to a second process temperature ($T_2$) greater than the first process temperature ($T_1$). The second process pressure is greater than about 1 Torr, and typically ranges between about 10 Torr and about 100 Torr. In one embodiment, the second process pressure is about 25 Torr. The higher process pressure ($P_2$) allows hydrogen gas to be flowed through the process chamber at a second flow rate ($R_2$) greater than the first flow rate ($R_1$). It is desirable to maximize the second flow rate while maintaining the second process pressure. The second flow rate is greater than about 3 SLM, and typically ranges between about 10 SLM and about 50 SLM. In one embodiment, the second flow rate is about 20 SLM.

As discussed above, at higher process pressures (and correspondingly higher hydrogen flow rates), increasing the process temperature was seen to result in a marked decrease in oxygen and carbon contamination levels. The wafer temperature is raised to second process temperature ($T_2$) that is greater than the first process temperature ($T_1$), but still not higher than about 800° C. The second process temperature is typically between about 775° C. and about 800° C. In one embodiment where the first process temperature is about 750° C., the second process temperature is about 780° C.

The silicon wafer at step 55 is maintained at the second process pressure and second process temperature while hydrogen gas is flowed at the second flow rate across the surface of the silicon wafer for up to about 3 minutes. In one embodiment, the silicon wafer is maintained at the second process pressure and the second process temperature while hydrogen gas is flowed at the second flow rate for about 2 minutes. Oxygen contamination levels of less than about $5\times10^{17}$ atoms per cubic centimeter, and carbon contamination levels of less than about $2\times10^{17}$ atoms per cubic centimeter, may be achieved after step 55.

The incorporation of steps 54 and 55 into processes of the present invention also can achieve at least the same level of contamination removal more quickly than steps 50 through 53 (or the embodiment described above, with reference to FIG. 2) alone. In one embodiment, the silicon wafer is maintained at the first process pressure ($P_1$) and the first process temperature ($T_1$) while hydrogen gas is flowed across the surface of the silicon wafer at the first flow rate ($R_1$) for about 1 minute. The silicon wafer is then maintained at the second process pressure ($P_2$) and the second process temperature ($T_2$) while hydrogen gas is flowed across the surface of the silicon wafer at the second flow rate ($R_2$) for about 1 minute. Such an embodiment removes in about 2 minutes substantially all interfacial oxygen and carbon contamination.

The process ends at 56, at which point the hydrogen flow is stopped. If the silicon wafer is to be processed further in the processing chamber, the pressure and temperature are adjusted for the next processing step. If the silicon wafer is to be transferred out of the processing chamber, the wafer is returned to the transfer temperature and the processing chamber to the transfer pressure (typically by introducing dry nitrogen gas), and the silicon wafer is then transferred out of the processing chamber into, e.g., a transfer chamber.

Figure 6:
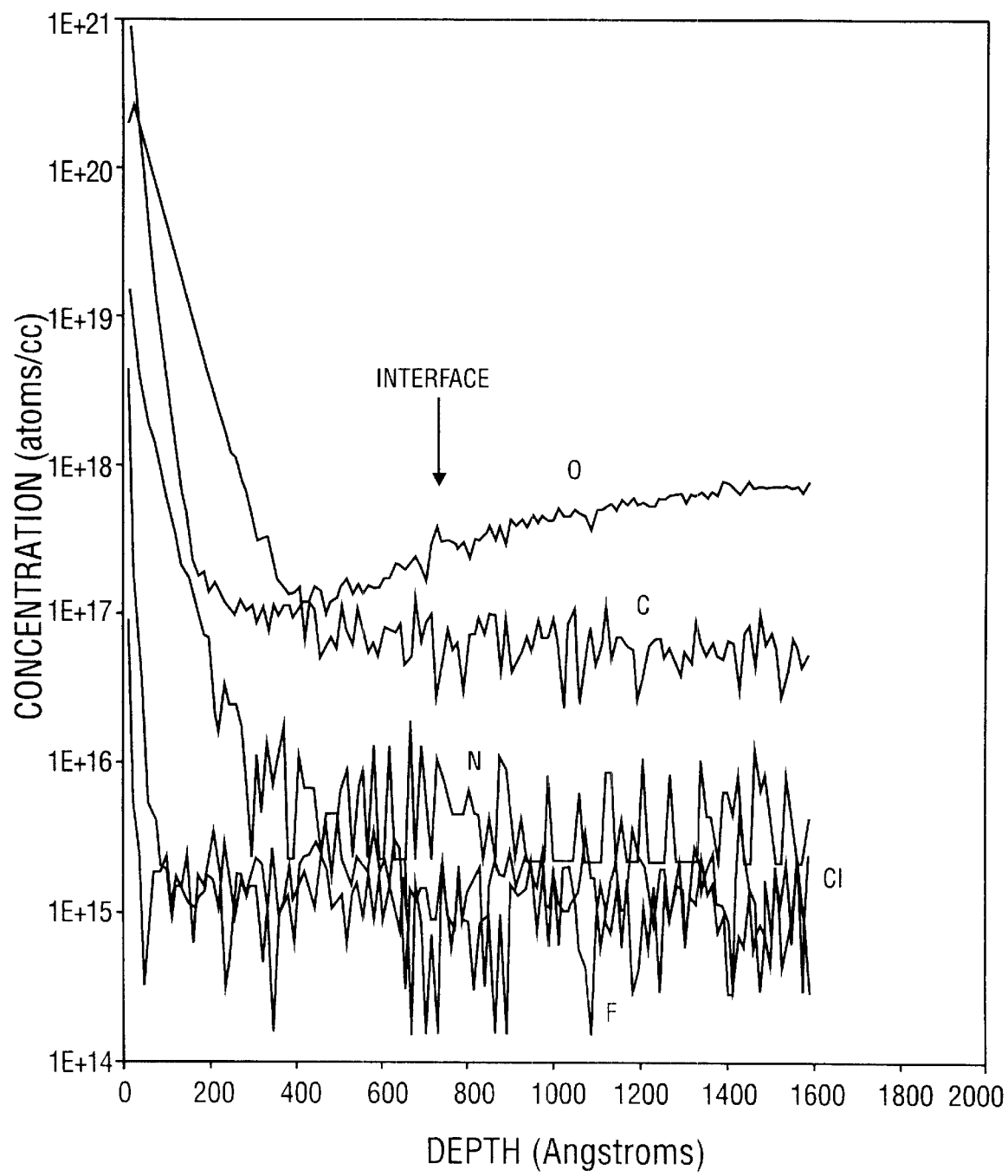
FIG. 6 is a graph showing interfacial contaminant concentrations remaining on a silicon surface after cleaning in accordance with the present invention as a function of wafer depth.

FIG. 6 shows the concentration levels of oxygen, carbon, nitrogen, chlorine and fluorine contamination remaining on a silicon surface, detected by secondary ion mass spectroscopy (SIMS), as a function of wafer depth after cleaning with the processes of the present invention. The graphs in FIG. 6 show that the processes of the present invention can achieve contamination levels below the detection limit of currently available SIMS for some contaminants. Given currently available SIMS detection limits, the processes of the present invention can remove substantially all interfacial oxygen, carbon, nitrogen, chlorine, and fluorine contamination from a silicon wafer surface.

The processes of the present invention provide low temperature cleaning of silicon surfaces without the use of a reactive gas, and so without the risk of contamination from the residues that such reactive gases can create. Moreover, the risk of the chamber or devices on the silicon wafer being attacked by such reactive gases during wafer cleaning is also eliminated. Processes in accordance with the present invention can be used to clean the surface of any type of silicon wafer. After being cleaned in accordance with the present invention, the silicon wafer may be processed by a variety of processing methods known to those of skill in the art.

As indicated above, the cleaning processes of the present invention may be carried out in the same chamber in which a further processing step, such as deposition of an electronic material, will be performed. Advantageously, however, the cleaning process is carried out in a dedicated cleaning chamber. A dedicated cleaning chamber reduces the risk that residues from other processing steps will contaminate the silicon wafer surface during the cleaning process. When used in conjunction with a process provided by the present invention, no reactive gases are introduced into the cleaning chamber, which is expected to reduce the time and cost involved in maintaining the chamber. The use of a dedicated cleaning chamber also is expected to increase the throughput of silicon wafers processed through a multi-chamber-clustered system, such as the one depicted in FIG. 1.

Figure 7A:
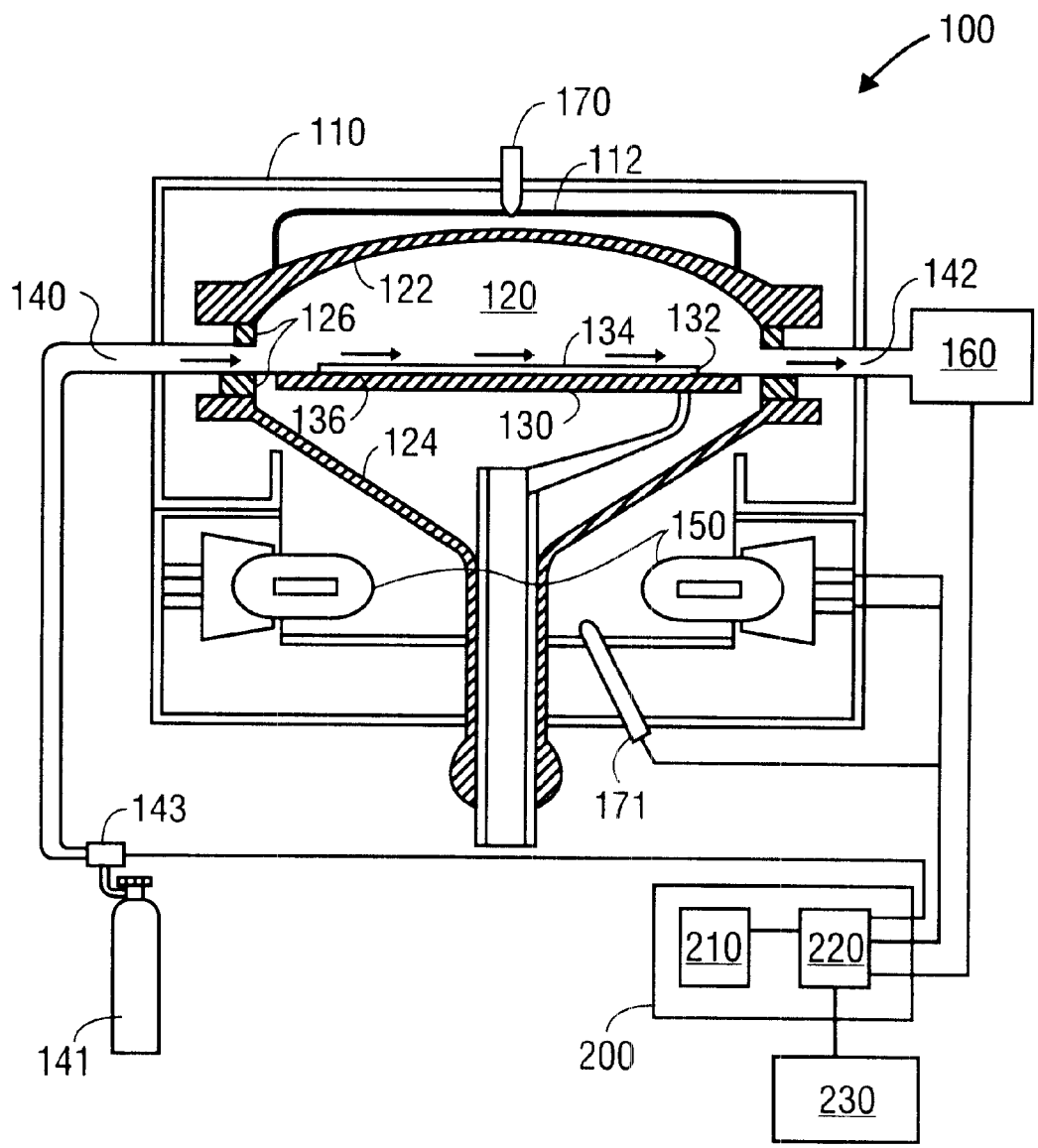
FIG. 7A is a cross sectional view of one embodiment of an apparatus for cleaning a silicon wafer according to the present invention.

FIG. 7A shows one embodiment of a dedicated apparatus for cleaning a surface of a silicon wafer in accordance with another aspect of the present invention. The cleaning apparatus of the present invention advantageously can be incorporated into a multi-chamber-clustered system as one of the plurality of single-wafer processing chambers. The inventive features of the present cleaning apparatus also can be incorporated into cleaning apparatuses that are not used in a multi-chamber clustered system. The cleaning apparatus of the present invention and its advantages will be described in conjunction with the processes of the present invention. However, those of ordinary skill in the art will recognize that other processes can be practiced with a cleaning apparatus of the present invention.

The embodiment of a cleaning apparatus 100 shown in FIG. 7A comprises a housing 110; a chamber 120 defined by an upper quartz dome 122, a lower quartz dome 124, and a quartz lining 126; a susceptor 130 positioned within the chamber 120 and configured to accommodate to a silicon wafer; a reflector 112 positioned outside the chamber 120; a heater 150, shown in this embodiment as a lamp module or a plurality of lamps; an inlet port 140 leading to a gas supply represented in FIG. 7A by a gas tank 141; and a vacuum port 142 leading to a vacuum system 160 for evacuating the chamber 120. The cleaning apparatus 100 includes a system controller 200 which controls various operations of the cleaning apparatus, such as gas flow, process temperature and process pressure.

As used with a process of the present invention, a silicon wafer 132 is first transferred into the chamber 120 from, e.g., a transfer chamber (not shown) and placed on the susceptor 130 such that a first surface 134 of the silicon wafer faces the reflector 112 and a second surface 136 contacts the susceptor 130. As described herein, the first surface 134 corresponds to the surface of the silicon wafer that is to be cleaned.

The vacuum system 160 evacuates the chamber 120 through the vacuum port 142. The vacuum port 142 is positioned opposite the inlet port 140 such that hydrogen gas introduced into the chamber flows from the inlet port 140 across the first surface 134 towards the vacuum port 142, as indicated by the arrows. Flowing the gas across the silicon wafer surface in this manner improves the leak integrity of the chamber because fewer seals are needed.

The vacuum system 160 may be the same vacuum system used in a multi-chamber-clustered system to evacuate the transfer chamber and/or other single-wafer processing chambers, or it may be a separate vacuum system dedicated to the cleaning apparatus.

In one embodiment, the vacuum system 160 comprises a vacuum pump that is placed near the chamber, or near the point of use, such that the conductance through the vacuum system and the flow rate of gas across the silicon wafer surface may be maximized. Any type of vacuum pump may be used in accordance with the present invention. Generally, increased conductance can be achieved by minimizing the length of vacuum line connecting the vacuum pump to the vacuum port and/or increasing the diameter of the vacuum line. Increasing the vacuum line diameter, however, increases outgassing and thus the risk of contamination, and also increases the cost of the vacuum system. Advantageously, less than 3 feet of vacuum line is used to connect the vacuum pump to the vacuum port. In one embodiment, a mechanical dry pump with a pumping speed of about 100 cubic meters per hour is connected with the chamber via about 1 to 3 feet of 2-inch diameter vacuum line and is operated with the throttle valve fully open.

Unlike other processing chambers which typically radiate heat towards the wafer from both the top and bottom surfaces, the heater 150 in the present cleaning apparatus 100 is configured to radiate heat through the lower quartz dome 124 towards only one surface (shown here as the second surface 136) of the silicon wafer 132. The reflector 112 reflects heat towards the other surface (shown here as the first surface 134). It has been observed that one-sided heating in conjunction with a reflector provides a more uniform temperature across the wafer (e.g., a variance of about ±1.5° C. has been observed). Additionally, one-sided heating with a reflector provides more reproducible heating from wafer to wafer in that the heating variation that is typically seen with wafers having different patterns and features is reduced. Heating from one surface of the wafer as opposed to both surfaces also reduces the cost of building and operating the cleaning apparatus.

In one embodiment, the heater 150 comprises a lamp module, or a plurality of lamps, positioned below the susceptor 130. Any type of lamp, such as halogen lamps, may be used. Other heating elements known to those of skill in the art, such as resistive heating elements, also can be used as the heater 150 in accordance with the present invention.

In one embodiment, the reflector 112 comprises a gold plating on a surface of the cleaning apparatus 100 that faces the first surface 134 of the silicon wafer 132. In another embodiment, the upper part of the chamber 120 is shielded from the short-wavelength radiation of the heater 150 so that the temperature of the silicon wafer 132 can be read correctly, even in the case of patterned wafers, by a pyrometer 170 placed directly above the silicon wafer.

The susceptor 130 advantageously is opaque, and absorbs heat from the heater 150 and transfers it to the second surface 136 of the silicon wafer with which it is in contact. The susceptor 130 may be made of solid silicon carbide, silicon carbide coated graphite, or any other material known in the art for such use. In one embodiment, the susceptor 130 is connected with a motor (not shown) that rotates the silicon wafer 132 within the chamber, so that the first surface 134 of the silicon wafer is more uniformly exposed to the gas flowing from the inlet port 140.

In another embodiment, the susceptor 130 has no rotation mechanism, and the inlet port 140 defines a slit that flows the gas across all of the first surface 134 in a plane. Because the one-sided heating configuration in conjunction with a reflector provides relatively uniform heating across the surface of the silicon wafer, rotation of the wafer is not necessary to provide uniform exposure to the heater. Elimination of a motor and other rotation hardware simplifies the construction and maintenance of the cleaning apparatus of the present invention.

All surfaces that define the chamber 120 comprise quartz. Quartz is preferred over metal to minimize the risk of outgassing from the chamber surfaces contaminating the silicon wafer. In one embodiment, the surfaces defining the chamber 120 are made of a low outgassing quartz. In another embodiment, the surfaces defining the chamber 120 are made of an infrared-transparent quartz that remains at a lower temperature than the silicon wafer when the heater is activated. In the embodiment shown, the surfaces defining the chamber 120 comprise the upper quartz dome 122, the lower quartz dome 124, and the quartz lining 126.

The embodiment of the cleaning apparatus shown in FIG. 7A includes a system controller 200 having a computer readable medium 210 and a processor 220. The processor 220 contains a single board computer (SBC), analog and digital input/output boards, interface boards and stepper motor controller boards (not shown). Various parts of the cleaning apparatus of the present invention conform to the Versa Modular Europeans (VME) standard that defines board, card cage, and connector dimensions and types. The VME standard also defines the bus structure having a 16-bit data bus and 24-bit address bus.

The system controller 200 controls all the operations of the cleaning apparatus 100. The system controller executes system control software, which is a computer program stored in or transmitted by the computer-readable medium 210. Computer-readable medium includes any mechanism for storing or transmitting information in a form readable by a computer, and includes, without limitation: memory; magnetic disk storage media; optical storage media; electrical, optical, acoustical, or other form of propagated signals; and the like. The computer program includes sets of instructions that dictate the timing, gas flow rates, process pressures, process temperatures, heater power levels, susceptor position, and other parameters of a particular process. Input/output devices 230 such as a monitor and a keyboard are used to interface between a user and the system controller 200.

A process of cleaning silicon surfaces in accordance with the present invention can be implemented using a computer program that is stored in or transmitted by the computer-readable medium. The computer program code can be written in any conventional computer readable programming language, such as 68000 assembly language, C, C++, Pascal, Fortran, or others. Also stored in or transmitted by the computer-readable medium are process parameters such as gas flow rates, process pressures and process temperatures necessary to carry out the processing of a silicon wafer in an apparatus of the present invention.

Figure 7B:
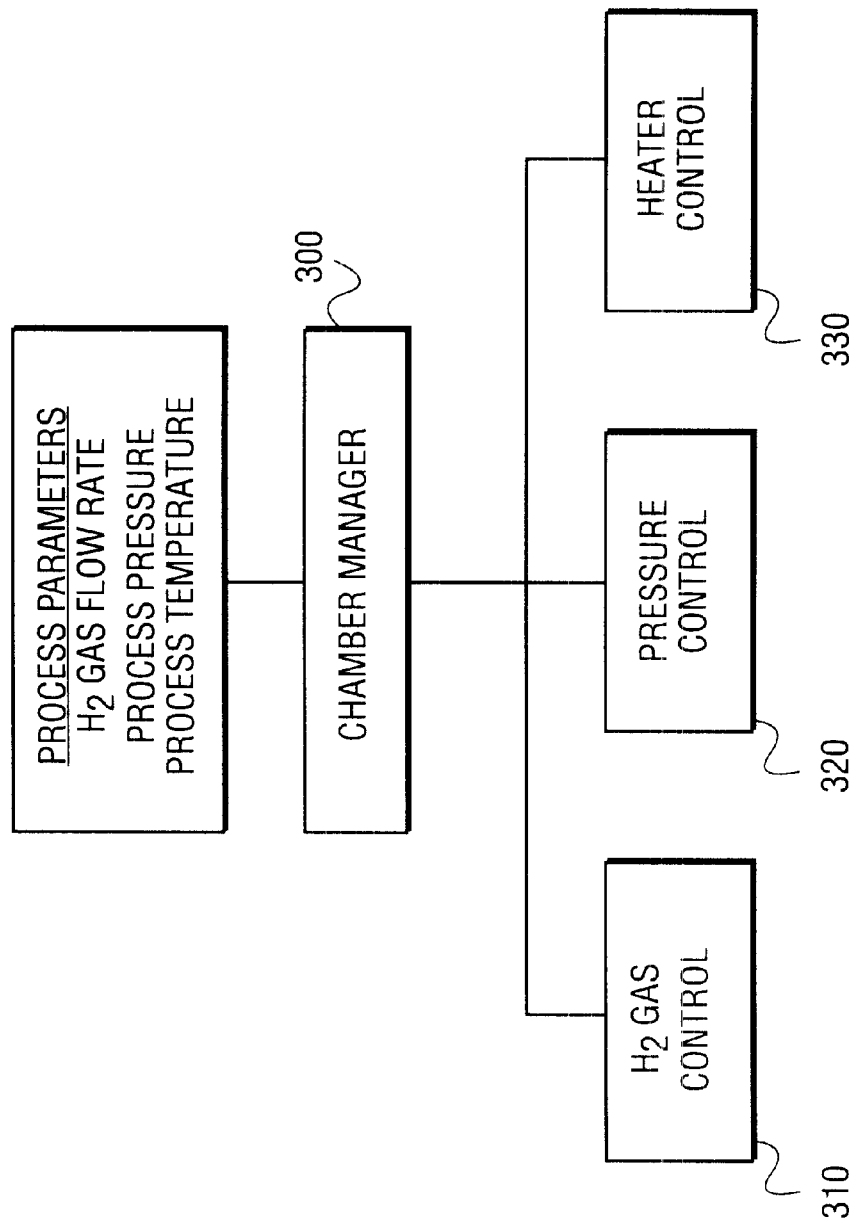
FIG. 7B illustrates a system control computer program that can be used to control a cleaning apparatus and/or implement a process of the present invention.

FIG. 7B illustrates an example of the hierarchy of the system control program for implementing a process according to the present invention. The system control program includes a chamber manager subroutine 300 that controls execution of various chamber component subroutines that control operation of the chamber components necessary to carry out the process. Examples of chamber component subroutines are hydrogen gas control subroutine 310, pressure control subroutine 320, and heater control subroutine 330. Those having ordinary skill in the art would readily recognize that other chamber control subroutines can be included depending on the processes desired to be performed in the chamber.

In operation, the chamber manager subroutine 300 selectively schedules or calls the chamber component subroutines in accordance with the process being executed. Typically, the chamber manager subroutine 300 includes steps of monitoring the various chamber components, determining which components need to be operated based on the process parameters for the process set to be executed and causing execution of a chamber component subroutine responsive to the monitoring and determining steps.

The hydrogen gas control subroutine 310 has program code for controlling hydrogen gas flow rates. The hydrogen gas control subroutine 310 controls the open/close position of the safety shut-off valves, and also ramps up/down a mass flow controller 143 to obtain the desired flow rate. The hydrogen gas control subroutine 310 is invoked by the chamber manager subroutine 300, as are all chamber component subroutines, and receives from the chamber manager subroutine 300 process parameters related to the desired flow rates. Typically, the hydrogen gas control subroutine 310 operates by opening the gas supply lines and repeatedly (i) reading the necessary mass flow controllers, (ii) comparing the readings to the desired flow rate parameters received from the chamber manager subroutine 300, (iii) and adjusting the mass flow controllers as necessary. Furthermore, the hydrogen gas control subroutine 310 includes steps for monitoring the hydrogen gas flow for unsafe flow rates, and activating the safety shut-off valves when an unsafe condition is detected.

The pressure control subroutine 320 comprises program code for controlling the pressure in the chamber 120 by regulating the size of the opening of the throttle valve in the vacuum system 160. The pressure control subroutine 320 controls the chamber pressure to the desired level in relation to the total process gas flow, chamber size, and pumping set point pressure for the exhaust system. Typically, the pressure control subroutine 320 operates by measuring the pressure in the chamber 120 by reading one or more conventional pressure manometers connected to the chamber; comparing the measured pressures to the desired process pressure parameters received from the chamber manager subroutine 300; obtaining PID (proportional, integral and differential) values from a stored pressure table corresponding to the desired process pressure; and adjusting the throttle valve according to the PID values obtained from the pressure table. In one embodiment, the process control subroutine measures the partial pressure of oxygen and water in the chamber 120, receives from the chamber manager subroutine desired partial pressure parameters, and adjusts the throttle valve accordingly. In another embodiment, the pressure control subroutine 320 is written to open or close the throttle valve to a particular opening size to regulate the pressure in the chamber.

The heater control subroutine 330 comprises program code for controlling the power provided to heater 150 that is used to heat the silicon wafer 132. The heater control subroutine 330 operates by measuring the temperature in the chamber 120 by reading the voltage output of temperature measurement devices, such as a pyrometer 171 aimed at the susceptor 130; comparing the measured temperature to the desired process temperature received from the chamber manager subroutine 300; and adjusting the power to the heater 150 to obtain the desired process temperature.

The processes and apparatuses of the present invention have been described with reference to certain embodiments. Those of ordinary skill in the art will recognize that numerous variations, modifications, and improvements can be made to the embodiments described above. For example, hydrogen gas may be passed through a purifying filter before being flowed across the silicon wafer surface in the present processes, and such a purifying filter may be added to an apparatus of the present invention. The scope of the present invention is not limited to the above embodiments, but is defined by the claims that follow.

What is claimed is:

1. A process for cleaning a surface of a silicon wafer in a chamber, the process comprising:
   first transferring the silicon wafer into the chamber;
   evacuating the chamber to a process pressure of less than about 1 Torr;
   while maintaining the process pressure, flowing a process gas mix consisting essentially of hydrogen gas across the surface of the silicon wafer;
   heating the silicon wafer to a process temperature of not higher than 800° C.; and
   maintaining the silicon wafer at the process pressure and at the process temperature while flowing the said process gas mix across the surface.

2. The process according to claim 1, wherein the silicon wafer is transferred into the chamber at a temperature less than the process temperature.

3. The process according to claim 1, wherein the silicon wafer is transferred into the chamber at a temperature between about 450° C. and about 600° C.

4. The process according to claim 1, wherein the silicon wafer is transferred into the chamber at a temperature of about 550° C.

5. The process according to claim 1, wherein the process pressure is between about 0.1 Torr and about 1 Torr.

6. The process according to claim 1, wherein the process pressure is between about 0.2 Torr and about 0.5 Torr.

7. The process according to claim 1, wherein hydrogen gas is flowed at a rate of between about 0.03 SLM and about 3 SLM.

8. The process according to claim 1, wherein hydrogen gas is flowed at a rate of about 0.3 SLM.

9. The process according to claim 1, further comprising maximizing the flow of hydrogen gas across the surface while maintaining the process pressure at less than about 1 Torr.

10. The process according to claim 1, wherein the process pressure is maintained while flowing hydrogen gas using a pumping speed of at least about 30 cubic meters per hour.

11. The process according to claim 1, wherein the process pressure is maintained while flowing hydrogen gas using a pumping speed between about 30 and about 200 cubic meters per hour.

12. The process according to claim 1, wherein the process pressure is maintained while flowing hydrogen gas using a pumping speed of about 100 cubic meters per hour.

13. The process according to claim 1, wherein the process temperature is between about 700° C. and about 800° C.

14. The process according to claim 1, wherein the process temperature is between about 750° C. and about 775° C.

15. The process according to claim 1, wherein the silicon wafer is maintained at the process pressure and at the process temperature while flowing hydrogen gas across the surface for less than about 5 minutes.

16. The process according to claim 1, wherein the silicon wafer is maintained at the process pressure and at the process temperature while flowing the hydrogen gas across the surface until substantially all interfacial oxygen contamination is removed from the surface.

17. The process according to claim 1, wherein evacuating the chamber occurs prior to heating the silicon wafer.

18. The process according to claim 1, wherein flowing hydrogen gas occurs prior to heating the silicon wafer.

19. The process according to claim 1, wherein the process pressure comprises a partial pressure of water and oxygen of less than about 10 $\mu$Torr.

20. The process according to claim 1, wherein the process pressure comprises a partial pressure of water and oxygen of between about 1 $\mu$Torr to about 5 $\mu$Torr.

21. A process for cleaning a surface of a silicon wafer in a chamber, the process comprising:
   first transferring the silicon wafer into the chamber;
   evacuating the chamber to a first process pressure of less than about 1 Torr;
   while maintaining the first process pressure, flowing hydrogen gas across the surface of the silicon wafer at a first flow rate;
   heating the silicon wafer to a first process temperature of not higher than about 800° C.;
   maintaining the silicon wafer at the first process pressure and at the first process temperature while flowing hydrogen gas at the first flow rate across the surface; then
   increasing the first process pressure to a second process pressure of greater than about 1 Torr;
   increasing the flow of hydrogen gas across the surface of the silicon wafer from the first flow rate to a second flow rate while maintaining the second process pressure;
   increasing the first process temperature to a second process temperature, the second process temperature still being not higher than about 800° C.; and maintaining the silicon wafer at the second process pressure and the second process temperature while flowing hydrogen gas at the second flow rate across the surface.

22. The process according to claim 21, wherein the second process pressure is between about 10 Torr and about 100 Torr.

23. The process according to claim 21, wherein the second flow rate is greater than about 3 SLM.

24. The process according to claim 21, wherein the second flow rate is between about 10 SLM and about 50 SLM.

25. The process according to claim 21, wherein the first process temperature is not higher than about 770° C.

26. The process according to claim 21, wherein the second process temperature is between about 775° C. and about 800° C.

27. The process according to claim 21, wherein the silicon wafer is maintained at the first process pressure and at the first process temperature while flowing hydrogen gas at the first flow rate across the surface for less than about 3 minutes, and wherein the silicon wafer is maintained at the second process pressure and at the second process temperature while flowing hydrogen gas at the second flow rate across the surface for less than about 3 minutes.

28. A process for cleaning a surface of a silicon wafer in a chamber, the process comprising:

first transferring the silicon wafer into the chamber at a transfer temperature of less than about 600° C.;

evacuating the chamber to a first process pressure of less than about 1 Torr;

flowing hydrogen gas across the surface of the silicon wafer at a first flow rate of up to about 3 SLM while maintaining the first process pressure;

heating the silicon wafer to a first process temperature of not higher than about 770° C.;

maintaining the silicon wafer at the first process pressure and at the first process temperature while flowing hydrogen gas across the surface at the first flow rate for less than about 3 minutes; then increasing the first process pressure to a second process pressure of between about 10 Torr and about 100 Torr;

increasing the flow of hydrogen gas across the surface of the silicon wafer from the first flow rate to a second flow rate of between about 10 SLM and about 50 SLM;

increasing the first process temperature to a second process temperature, the second process temperature being not higher than about 800° C.; and maintaining the silicon wafer at the second process pressure and the second process temperature while flowing hydrogen gas at the second flow rate across the surface for not more than about 3 minutes.

29. The process according to claim 28, wherein the first process pressure is between about 0.1 Torr and about 1 Torr.

30. The process according to claim 28, wherein the first process pressure is between about 0.2 Torr and about 0.5 Torr.

31. The process according to claim 28, wherein the first flow rate is between about 0.03 SLM and about 3 SLM.

32. The process according to claim 28, wherein the first flow rate is about 0.3 SLM.

33. The process according to claim 28, wherein the first process temperature is between about 700° C. and about 770° C.

34. The process according to claim 28, wherein evacuating the chamber occurs prior to heating the silicon wafer.

35. The process according to claim 28, wherein flowing hydrogen gas occurs prior to heating the silicon wafer.

36. The process according to claim 28, wherein the second process pressure is about 25 Torr.

37. The process according to claim 28, wherein the second flow rate is about 20 SLM.

38. The process according to claim 28, wherein the first process temperature is about 750° C. and the second process temperature is about 780° C.

39. The process according to claim 28, wherein the second process temperature is between about 775° C. and about 800° C.

40. The process according to claim 28, wherein the silicon wafer is maintained at the first process pressure and at the first process temperature while flowing hydrogen gas at the first flow rate across the surface for about 1 minute.

41. The process according to claim 28, wherein the silicon wafer is maintained at the second process pressure and at the second process temperature while flowing hydrogen gas at the second flow rate across the surface for about 1 minute.

* * * * *